US007944316B2

(12) United States Patent
Watanabe et al.

(10) Patent No.: US 7,944,316 B2
(45) Date of Patent: May 17, 2011

(54) MULTI-PHASE OSCILLATOR

(75) Inventors: Seiji Watanabe, Kyoto (JP); Takashi Oka, Osaka (JP); Tetsuo Arakawa, Osaka (JP)

(73) Assignee: Panasonic Corporation, Osaka (JP)

( * ) Notice: Subject to any disclaimer, the term of this patent is extended or adjusted under 35 U.S.C. 154(b) by 403 days.

(21) Appl. No.: 12/091,245

(22) PCT Filed: Nov. 30, 2006

(86) PCT No.: PCT/JP2006/324001
§ 371 (c)(1),
(2), (4) Date: Apr. 23, 2008

(87) PCT Pub. No.: WO2007/063965
PCT Pub. Date: Jun. 7, 2007

(65) Prior Publication Data
US 2009/0261911 A1    Oct. 22, 2009

(30) Foreign Application Priority Data
Dec. 2, 2005 (JP) ................................. 2005-348983

(51) Int. Cl.
*H03B 27/01* (2006.01)
(52) U.S. Cl. .................... 331/45; 331/2; 331/46; 331/57
(58) Field of Classification Search ................ 331/2, 45, 331/57, 46
See application file for complete search history.

(56) References Cited

U.S. PATENT DOCUMENTS

| 5,357,217 A | 10/1994 | Marchesi et al. |
| 5,475,344 A | 12/1995 | Maneatis et al. |
| 5,592,126 A | 1/1997 | Boudewijns et al. |
| 5,592,127 A | 1/1997 | Mizuno |
| 5,717,362 A | 2/1998 | Maneatis et al. |
| 6,025,756 A | 2/2000 | Miyabe |
| 6,891,442 B2 * | 5/2005 | Allen et al. ................ 331/57 |
| 2002/0003452 A1 | 1/2002 | Mizuno et al. |
| 2004/0012453 A1 | 1/2004 | Dally et al. |
| 2004/0263265 A1 | 12/2004 | Allen et al. |
| 2005/0057316 A1 | 3/2005 | Kim |
| 2005/0128011 A1 | 6/2005 | Wakii |
| 2006/0049879 A1 | 3/2006 | Chiang |
| 2008/0068101 A1 * | 3/2008 | Dosho et al. ............... 331/57 |

FOREIGN PATENT DOCUMENTS

JP          06-188634          7/1994

(Continued)

OTHER PUBLICATIONS

Japanese Notice of Reasons for Rejections, w/ English translation thereof, issued in Japanese Patent Application No. JP 2007-548010 dated Sep. 7, 2010.

*Primary Examiner* — Arnold Kinkead
(74) *Attorney, Agent, or Firm* — McDermott Will & Emery LLP

(57) ABSTRACT

A multi-phase oscillator includes a plurality of ring oscillators (21) each having a plurality of output ports and each formed by connecting an odd number of inverters (20) in a ring, and a plurality of resistance elements (30) coupling the output ports between the plurality of ring oscillators (21) so that all of the plurality of ring oscillators (21) operate at an identical frequency while keeping a desired phase relationship. The number of the ring oscillators (21) is not limited to an odd number but may be an even number. The multi-phase oscillator changes the state of a succeeding node of a phase coupling to accord with the state of a preceding node of the phase coupling by using the resistance elements (30) as phase coupling devices. If resistors are used as the resistance elements (30), the phase output accuracy greatly improves and high frequency oscillation is possible.

19 Claims, 9 Drawing Sheets

FOREIGN PATENT DOCUMENTS

| | | |
|---|---|---|
| JP | 07-507435 | 8/1995 |
| JP | 08-070239 | 3/1996 |
| JP | 11-68522 | 3/1999 |
| JP | 11-074762 | 3/1999 |
| JP | 2000-156629 | 6/2000 |
| JP | 2001-332698 | 11/2001 |
| JP | 2003-188689 | 7/2003 |
| JP | 2005-006025 | 1/2005 |
| JP | 2005-94754 | 4/2005 |
| WO | WO 94/26026 | 11/1994 |

\* cited by examiner

MULTI-PHASE OSCILLATOR

RELATED APPLICATIONS

This application is the U.S. National Phase under 35 U.S.C. §371 of International Application No. PCT/JP2006/324001, filed on Nov. 30, 2006, which in turn claims the benefit of Japanese Application No. 2005-348983, filed on Dec. 2, 2005, the disclosures of which Applications are incorporated by reference herein.

TECHNICAL FIELD

The present invention relates to a multi-phase oscillator for obtaining a plurality of output signals having different phases.

BACKGROUND ART

According to a conventional technique, a plurality of ring oscillators each including an odd number of inverters are connected in a loop to form a loop-type multi-phase oscillator. One node in each ring oscillator is connected to a corresponding node in the ring oscillator of the next stage via inverters for phase coupling (see Patent Document 1).

According to another conventional technique, a plurality of ring oscillators, each including an odd number of inverters, are connected in an array to form an array-type multi-phase oscillator with high phase resolution. Each of a plurality of nodes in each ring oscillator is connected to a corresponding node in the adjacent ring oscillator via an inverter for phase coupling (see Patent Document 2).

Patent Document 1: Specification of U.S. Pat. No. 5,592,126

Patent Document 2: Specification of U.S. Pat. No. 5,475,344

DISCLOSURE OF INVENTION

Problems to be Solved by the Invention

In the above conventional array-type multi-phase oscillator, the state of the succeeding node of a phase coupling is inverted by an inverter; therefore, the number of the ring oscillators is limited to an odd number in order to form a phase coupling path sequentially connecting the plurality of ring oscillators in a loop. In addition, due to relative variations among the transistors constituting the phase-coupling inverters, the delay amount varies depending on the locations of the inverters, and as a result, the phase integral linearity and phase differential linearity (hereinafter referred to as "phase output accuracy") of a multi-phase output deteriorate. The conventional array-type multi-phase oscillator also has a problem that it is difficult to carry out high frequency oscillation because the load which is to be driven by the preceding node of a phase coupling is the gate capacitance of the transistor, that is, the load capacitance is heavy.

An object of the present invention is to solve the above problems in the conventional array-type multi-phase oscillator.

Means for Solving the Problems

To achieve the above object, a multi-phase oscillator of the present invention does not invert the state of the succeeding node of a phase coupling by the inverter but is going to change the state of the succeeding node of a phase coupling to accord with the state of the preceding node of the phase coupling by using a resistance element as a phase coupling device.

Specifically, a multi-phase oscillator of the present invention includes a plurality of ring oscillators each having a plurality of output ports and each formed by connecting an odd number of inverters in a ring, and a plurality of resistance elements coupling the output ports between the plurality of ring oscillators so that all of the plurality of ring oscillators operate at an identical frequency while keeping a desired phase relationship. The number of the ring oscillators is not limited to an odd number but may be an even number.

If resistors are used as the resistance elements, the phase output accuracy greatly improves because the relative accuracy of the resistors is much greater than that of transistors, and high frequency oscillation is possible because the parasitic capacitance of the resistors is much smaller than that of the transistors.

If transistors in a conducting state are used as the resistance elements, the load which is to be driven by the preceding node of a phase coupling is a drain capacitance and a source capacitance. In this case, the load is light as compared with the gate capacitance resulting from the conventional inverters for phase coupling. Therefore, high frequency oscillation is possible.

Effects of the Invention

According to a multi-phase oscillator of the present invention, the number of ring oscillators is not limited to any number, and therefore, the number of output signals can be chosen from a broader range of options In addition, the phase output accuracy greatly improves when resistors are used as phase coupling devices. Moreover, the resistance elements for phase coupling have lighter loads, which readily enable high frequency oscillation.

Figure 1:
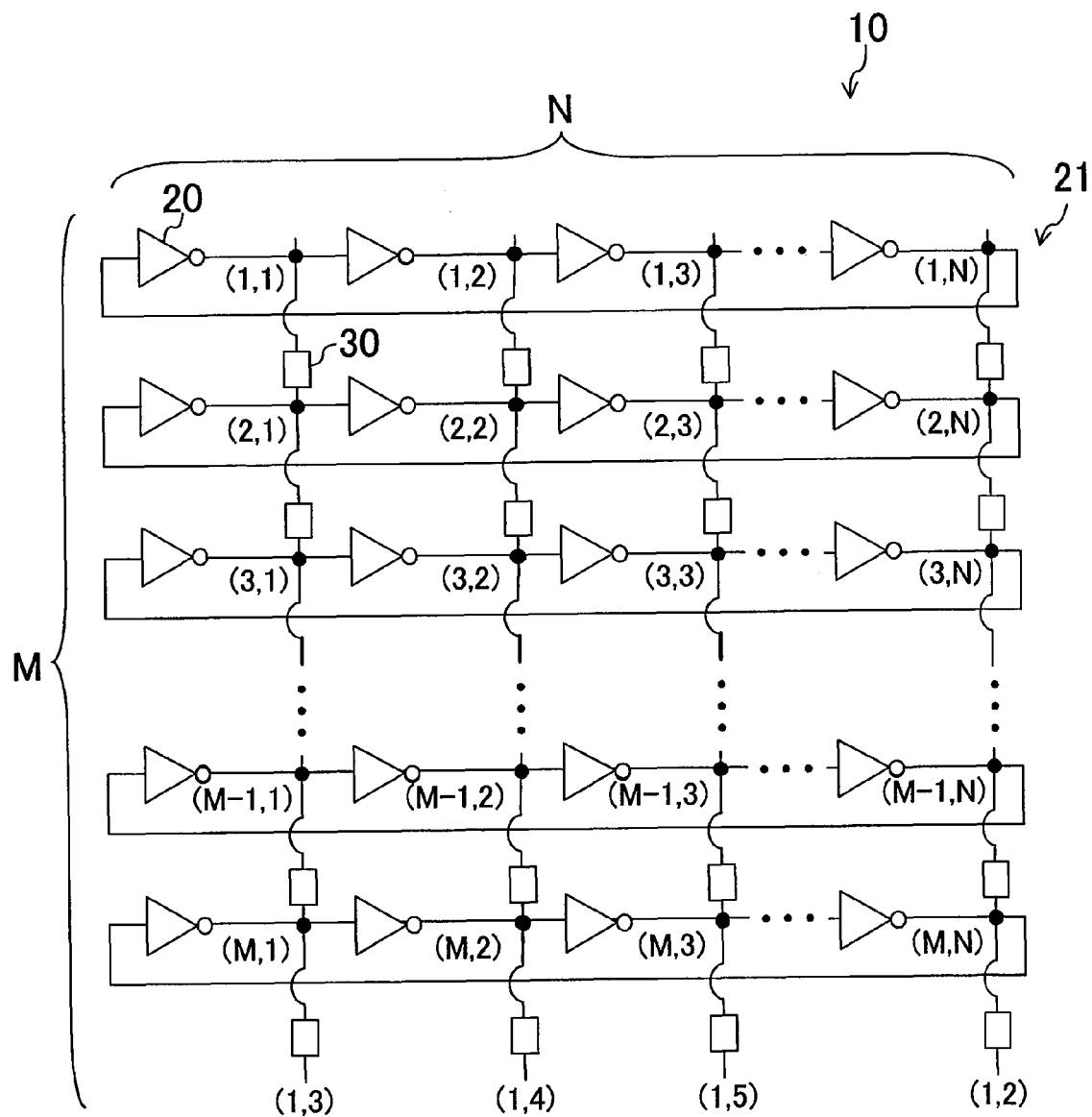
FIG. 1 is a circuit diagram showing a configuration example of a multi-phase oscillator according to the present invention.

DESCRIPTION OF REFERENCE NUMERALS 10 multi-phase oscillator
20 inverter
21 ring oscillator
30 resistance element
31 resistor
32 NMOS transistor
33 PMOS transistor
34 inverter
40 resistance element with switch
50 voltage-current converter

BEST MODE FOR CARRYING OUT THE INVENTION

Embodiments of the present invention will hereinafter be described with reference to the drawings.

FIG. 1 is a configuration example of a multi-phase oscillator according to the present invention. The multi-phase oscillator 10 of FIG. 1 is an array-type oscillator including M ring oscillators 21 each formed by connecting N inverters 20 to form a ring, and M×N resistance elements 30 for phase coupling. Each ring oscillator 21 has N output ports. The M×N resistance elements 30 couple the output ports between the M ring oscillators 21 so that all the M ring oscillators 21 operate at an identical frequency while keeping a desired phase relationship. Here, N is an odd number, and M can be either an odd or even number.

In the example of FIG. 1, a phase coupling path is formed by sequentially connecting all the ring oscillators 21 in a loop to return to the first ring oscillator. Specifically, the order of phase coupling is as follows, where each output port is represented by a set of two numbers (ordinate number, abscissa number):

(1, 1), (2, 1), (3, 1), . . . , (M, 1),
(1, 3), (2, 3), (3, 3), . . . , (M, 3),
(1, 5), (2, 5), (3, 5), . . . , (M, 5),
. . . ,
(1, N), (2, N), (3, N), . . . , (M, N),
(1, 2), (2, 2), (3, 2), . . . , (M, 2),
(1, 4), (2, 4), (3, 4), . . . , (M, 4),
. . . ,
(1, N−1), (2, N−1), (3, N−1), . . . , (M, N−1),
(1, 1), . . .

Figure 2A:
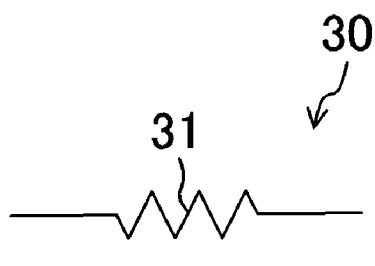
FIGS. 2(a) through 2(d) are circuit diagrams each showing a concrete example of the resistance element of FIG. 1.
Figure 2B:
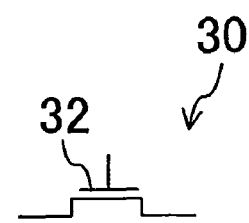
Figure 2C:
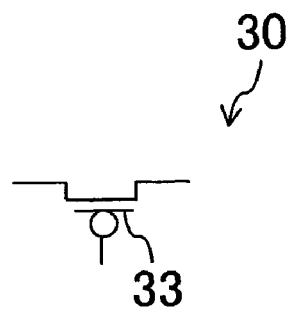
Figure 2D:
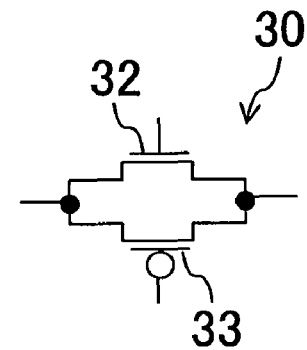

Each of FIGS. 2(a) through 2(d) is a concrete example of the resistance elements 30 of FIG. 1. FIG. 2(a) shows an example where a resistor 31 is used as the resistance element 30. FIG. 2(b) shows an example where the channel resistance of an NMOS transistor 32 in a conducing state is used as the resistance element 30. FIG. 2(c) shows an example where the channel resistance of a PMOS transistor 33 in a conducting state is used as the resistance element 30. FIG. 2(d) shows an example where a combination of an NMOS transistor 32 and a PMOS transistor 33 is used as the resistance element 30. These structures of the resistance elements 30 can be used in combination by connecting them in series, for example.

Figure 3:
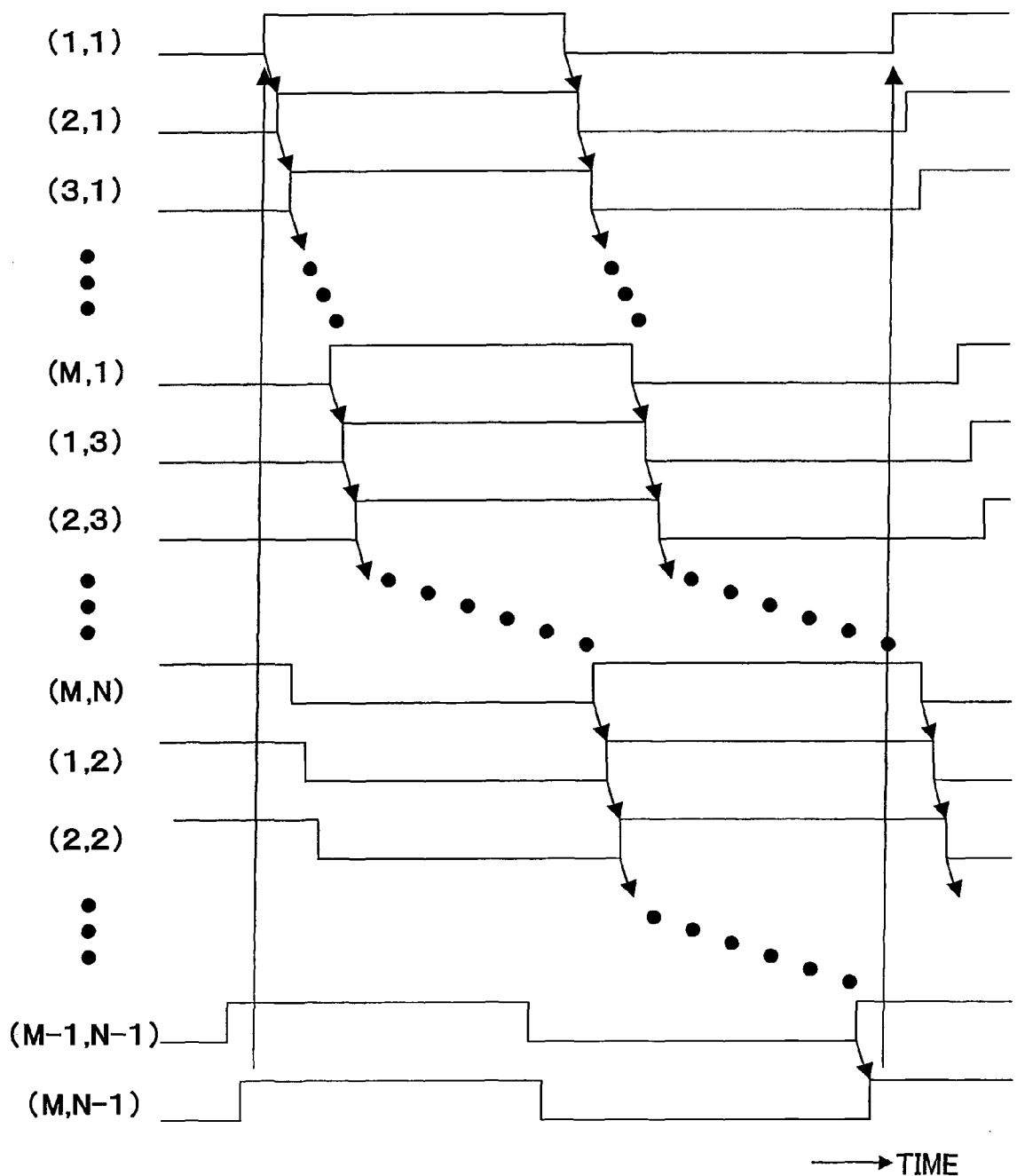
FIG. 3 is a timing diagram of the multi-phase oscillator of FIG. 1.

FIG. 3 is a timing diagram of the multi-phase oscillator 10 of FIG. 1. First, when the output (1, 1) of the first ring oscillator transitions to a high level, the output (2, 1) of the second ring oscillator, at the succeeding node of the phase coupling, changes to a high level. When the output (2, 1) transitions to a high level, the output (3, 1) of the third ring oscillator, at the succeeding node of the phase coupling, changes to a high level. In this way, the outputs of the ring oscillators, at the succeeding nodes of the phase coupling, sequentially change to a high level until the first stage output (M, 1) of the $M^{th}$ ring oscillator changes to a high level.

Then, when the output (M, 1) of the $M^{th}$ ring oscillator transitions to a high level, the output (1, 3) of the first ring oscillator, at the succeeding node of the phase coupling, changes to a high level. In the first ring oscillator, the level of the output (1, 1) is high, and accordingly, the level of the output (1, 2) is low, and the level of the output (1, 3) becomes high, which means logical operations are consistent. When the output (1, 3) of the first ring oscillator transitions to a high level, the output (2, 3) of the second ring oscillator, at the succeeding node of the phase coupling, changes to a high level. Such operations are repeated until the $N^{th}$ stage output (M, N) of the $M^{th}$ ring oscillator changes to a high level.

According to the order of phase coupling, the process then returns to the first ring oscillator for phase-coupling to the output (1, 2), so that the state of the output (1, 2) at the low level as mentioned in the above changes to a high level. When the output (1, 2) of the first ring oscillator transitions to a high level, the output (2, 2) of the second oscillator, at the succeeding node of the phase coupling, changes to a high level. Such operations are repeated until the $N-1^{th}$ stage output (M, N−1) of the $M^{th}$ ring oscillator changes to a high level. Then, according to the order of phase coupling, the process returns to the first ring oscillator to change the output (1, 1) to a high level.

Here, the output (1, N) has already been changed to a high level during the sequential changes of the outputs to a high level by phase coupling. The output (1, 1) has been a low level because the output (1, 1) is the logical inverse output of the output (1, N) of the first ring oscillator, but is now changed to a high level again in response to the $N-1^{th}$ stage output (M, N−1) of the $M^{th}$ ring oscillator.

The above operations are one cycle of the multi-phase oscillation outputs, and thereafter, the like operations are repeated. The above process is explained with the sequential propagation of the high level but maybe explained with the sequential propagation of the low level.

The oscillation frequency of the multi-phase oscillator 10 of FIG. 1 depends on the oscillation frequencies of the ring oscillators 21. As for a phase coupling path from the output (1, 1) via the output (M, 1) to the output (1, 3), a multi-phase output is generated to interpolate a period extending from the transition of the output (1, 1) to the transition of the output (1, 3). A phase coupling relationship of this kind also exists in a path from the output (1, 3) via the output (M, 3) to the output (1, 5) and similar relationships exist in many other locations. As a result, a multi-phase output having phases which divide one cycle of the ring oscillator 21 into M×N equal parts is generated.

Figure 4:
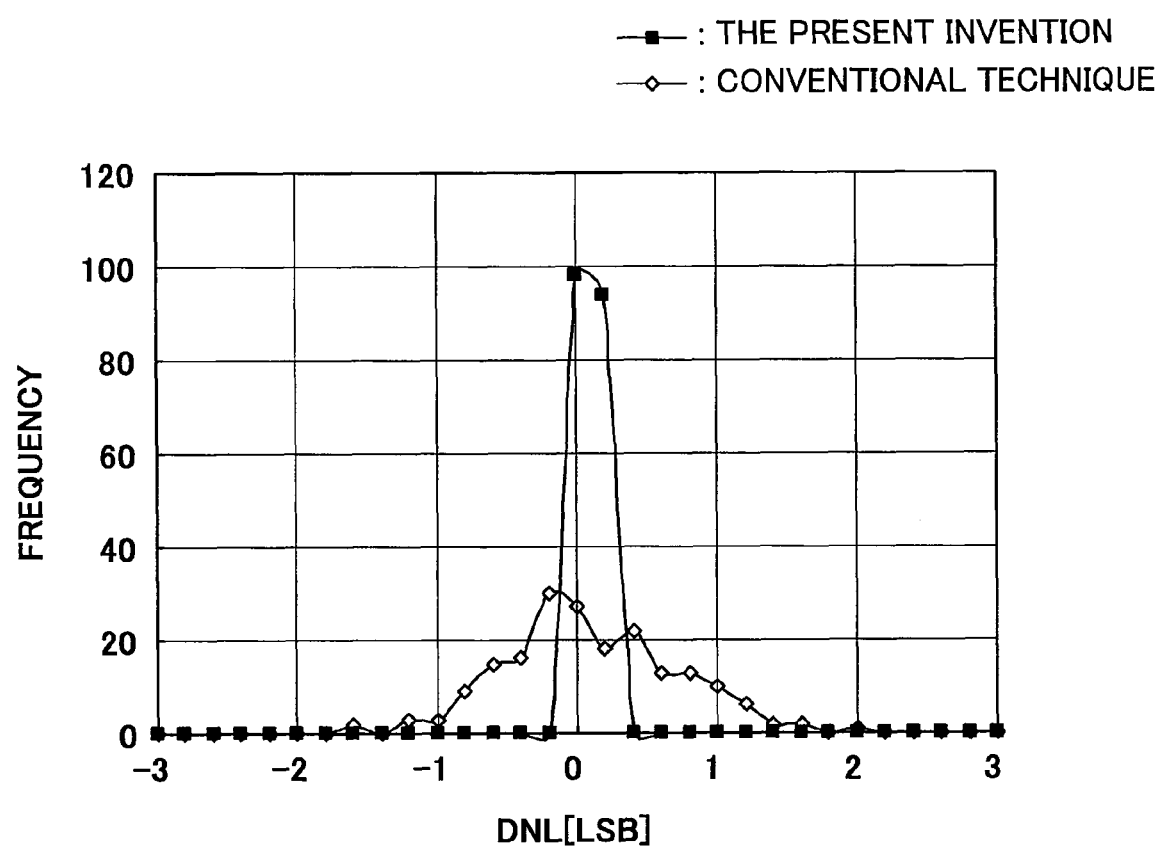
FIG. 4 is a graph showing the phase output accuracy of the multi-phase oscillator of FIG. 1.

FIG. 4 is a graph showing the phase output accuracy of the multi-phase oscillator 10 of FIG. 1 in which a resistor 31 is used as a resistance element 30, in comparison with a conventional example using an inverter for phase coupling. The phase output accuracy greatly improves because the relative accuracy of the resistor 31 is much greater than that of a transistor. In addition, high frequency oscillation is possible because the parasitic capacitance of the resistor 31 is much smaller than that of a transistor.

In the example of FIG. 1, the inverters 20 are used as the devices constituting each ring oscillator 21. However, the invertors 20 can be replaced with logic devices, such as NAND gates, or with devices capable of voltage-controlled oscillation or current-controlled oscillation.

In the example of FIG. 1 the output (M, 1) is phase-coupled to the output (1, 3). However, the output (M, 1) can be phase-coupled to any output which has a phase logically equal to that of the output (M, 1), for example, the output (1, 5), (1, 7), or the like.

The above-described example provides a phase coupling path connecting all the outputs of all the ring oscillators 21 in a loop. However, the resistance elements 30 for phase coupling can be thinned in applications where the required accuracy of linearity is not very high.

Figure 5:
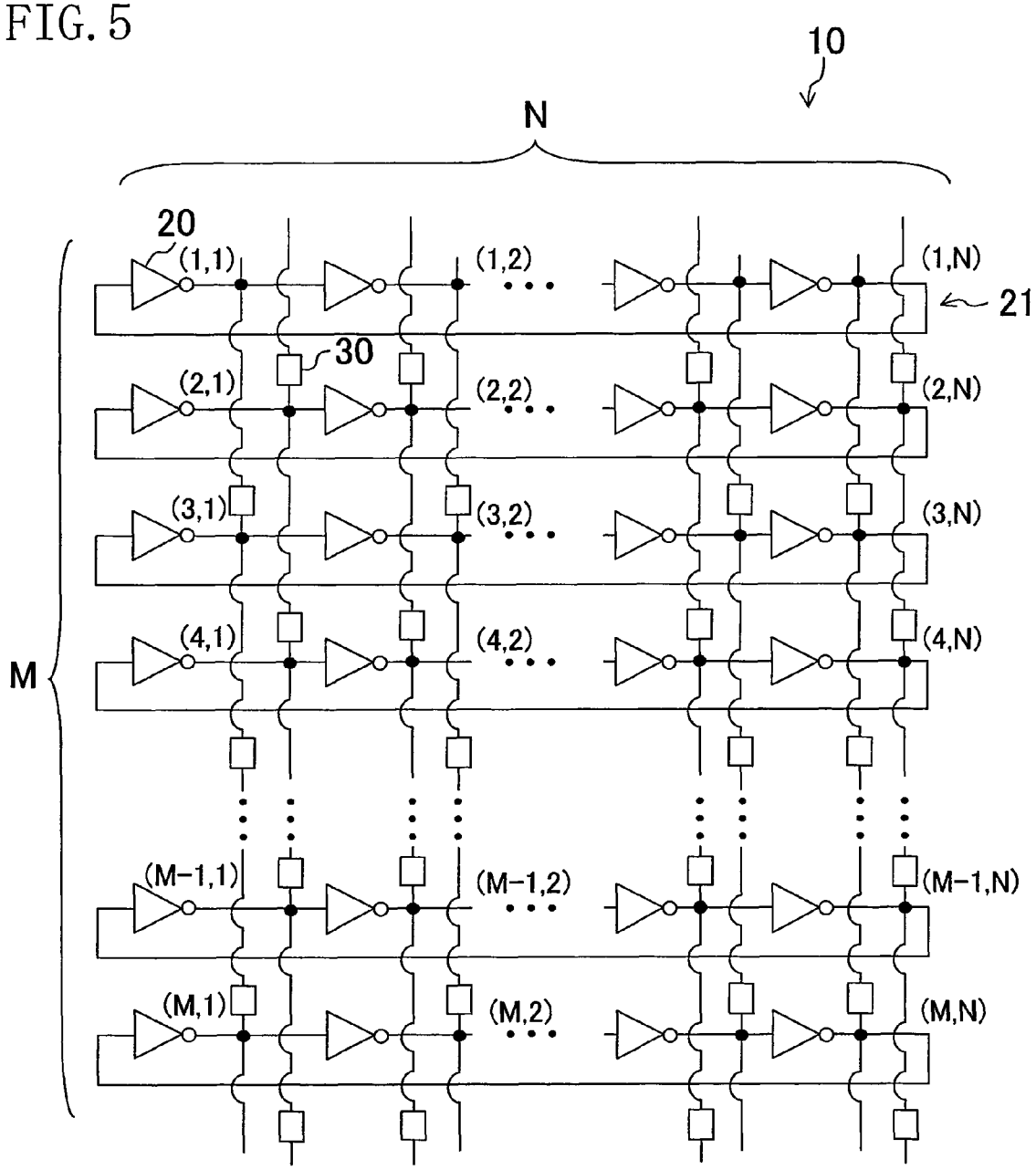
FIG. 5 is a circuit diagram showing the first modification of the multi-phase oscillator of FIG. 1.

FIG. 5 shows the first modification of the multi-phase oscillator 10 of FIG. 1. FIG. 5 appears to be different from FIG. 1. However, only the order of phase outputs is different, and the operations are equivalent to those in FIG. 1.

Figure 6:
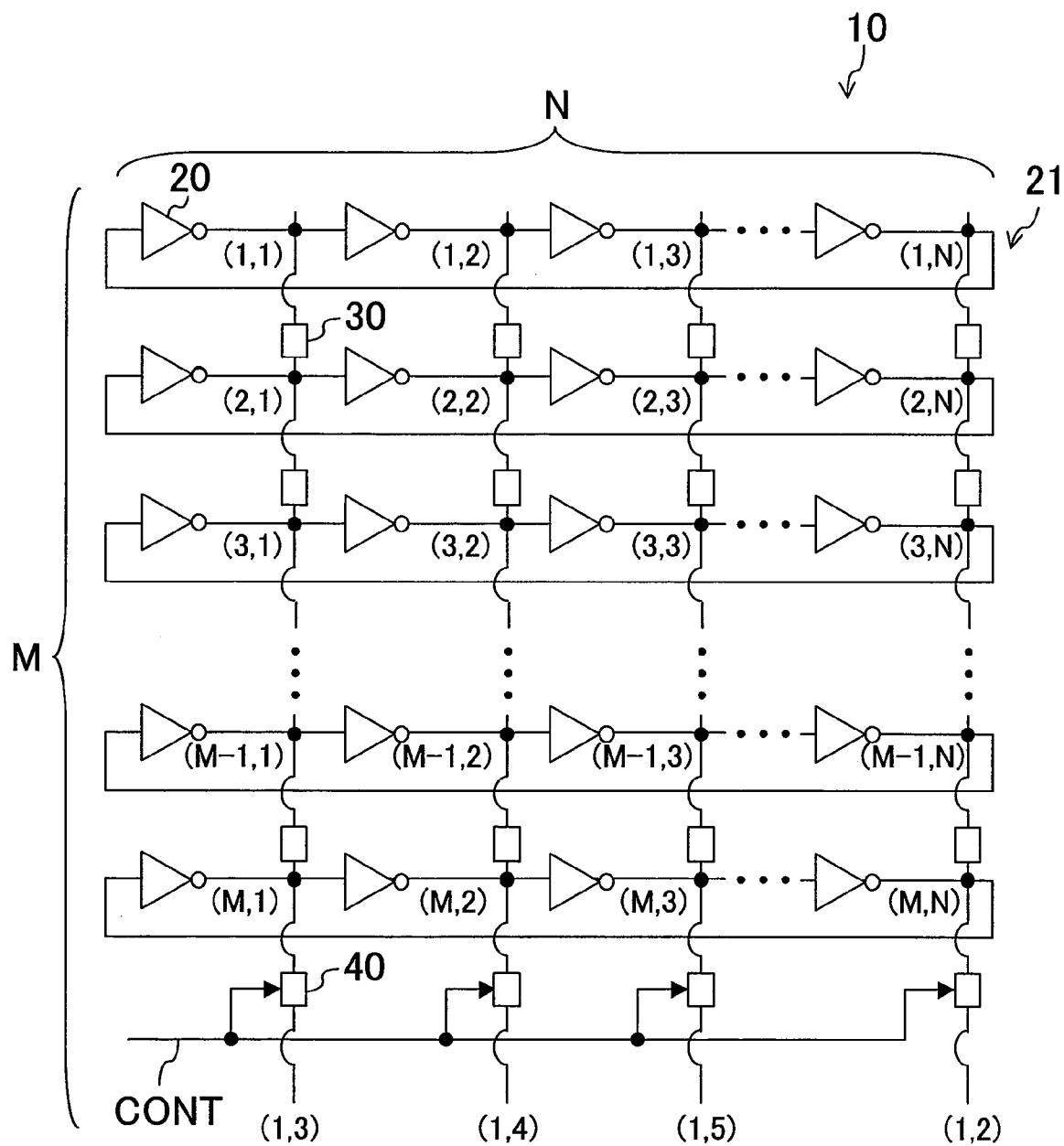
FIG. 6 is a circuit diagram showing the second modification of the multi-phase oscillator of FIG. 1.

FIG. 6 shows the second modification of the multi-phase oscillator 10 of FIG. 1. The configuration of FIG. 6 uses resistance elements 40 each of which has a switch in place of the N resistance elements 30 phase-coupling the $M^{th}$ ring oscillator and the first ring oscillator of FIG. 1. These resistance elements 40 with a switch are ON/OFF-controlled by control signal CONT.

In the configuration of FIG. 6, if an error, for example, a phase shift of one cycle at a succeeding node of a phase coupling ever occurs and the phase coupling stabilizes in an unintended state, the phase coupling between the $M^{th}$ ring oscillator and the first ring oscillator is decoupled by the resistance elements 40 with a switch. This makes it possible to initialize all the outputs of the first to $M^{th}$ ring oscillators to be in equiphase. If the phase is coupled again between the $M^{th}$ and first ring oscillators in this equiphase state, then the phase coupling can be in an originally-intended state which is most approximate to the equiphase state.

In the example of FIG. 6, the phase is coupled and decoupled between the $M^{th}$ and first ring oscillators. However, the phase can be coupled and decoupled between any combination of ring oscillators, for example, the pair of the first and second ring oscillators, the pair of the second and third ring oscillators, etc.

Figure 7A:
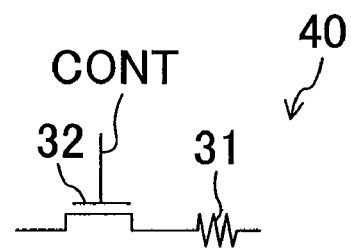
FIGS. 7(a) through 7(c) are circuit diagrams each showing a concrete example of the resistance element with a switch of FIG. 6.
Figure 7B:
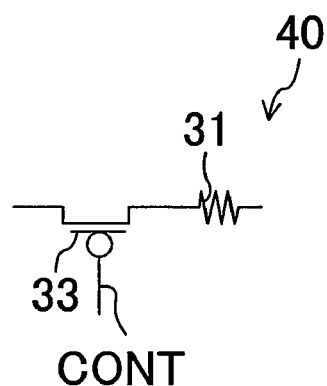
Figure 7C:
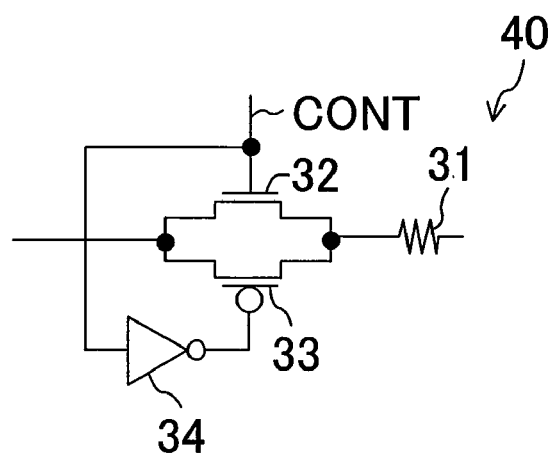

FIGS. 7(a) through 7(c) each shows a concrete example of the resistance elements 40 with a switch of FIG. 6. FIG. 7(a) shows an example where a series circuit of a resistor 31 and an NMOS transistor 32 is used as the resistance element 40 with a switch. FIG. 7(b) shows an example where a series circuit of a resistor 31 and a PMOS transistor 33 is used as the resistance element 40 with a switch. FIG. 7(c) shows an example where a series circuit of a resistor 31 and a circuit including an NMOS transistor 32 and a PMOS transistor 33 connected in parallel is used as the resistance element 40 with a switch. Signal CONT is supplied to the gate of the NMOS transistor 32, and a signal from an inverter 34, which is the inverse of signal CONT, is supplied to the gate of the PMOS transistor 33.

With the configurations of FIGS. 7(a) through 7(c), it is possible to greatly improve the phase output accuracy by setting the resistance values of the transistors 32 and 33 in a conducting state to low values and thereby relatively increasing the ratio of the resistance value of the resistor 31.

The resistor 31 may be connected to both sides of the transistors 32 and 33 or may be placed between the transistors 32 and 33 such that the transistors 32 and 33 sandwich the resistor 31.

As for phase-coupled outputs having different states, if the resistance value of the phase coupling is small, the voltage of the higher level output drops while the voltage of the lower level output rises. These output level variations can lead to occurrence of abnormal inversion timing of the ring oscillators 21 or occurrence of abnormal output timing of a circuit which converts the levels of the outputs of the ring oscillators 21 to generate binary digital outputs. Although there is no problem so long as the same phenomenon occurs uniformly across all the locations, there are usually variations across the locations, and hence, there is a concern that the phase output accuracy sharply decline.

With lower oscillation frequencies, the inverters 20 constituting the ring oscillators 21 have lower transistor drive capabilities. The output level variations are likely to be large if the resistance values of the resistance elements 30 for phase coupling are consistent. Thus, the resistance values of the resistance elements 30 need to be set to larger values. On the contrary, with higher oscillation frequencies, the inverters 20 constituting the ring oscillators 21 have higher transistor capabilities. Therefore, when the resistance values of the resistance elements 30 for phase coupling are consistent, the output level variations are small. The phase output accuracy is further improved by decreasing the resistance values of the resistance elements 30.

As described above, it is preferable to vary the resistance values of the resistance elements 30 according to the oscillation frequencies in order to optimize the phase output accuracy. Described below are examples of how to vary the resistance values of the resistance elements 30.

Figure 8:
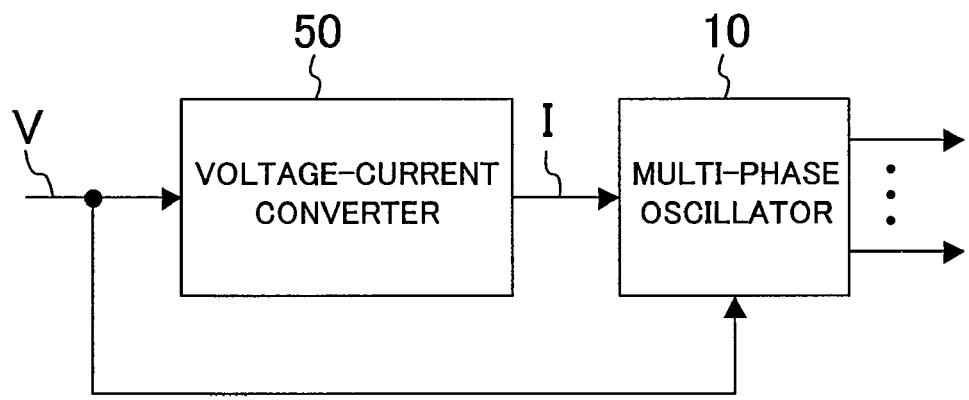
FIG. 8 is a block diagram showing a configuration example of a multi-phase oscillation circuit including a multi-phase oscillator according to the present invention.

FIG. 8 shows a configuration example of a multi-phase oscillation circuit including the multi-phase oscillator 10 according to the present invention. The multi-phase oscillation circuit of FIG. 8 includes a voltage-current converter 50 in addition to the multi-phase oscillator 10. The voltage-current converter 50 receives input voltage V from a voltage-controlled oscillator and converts this input voltage V to current I. Here, current I increases monotonously according to input voltage V.

Figure 9:
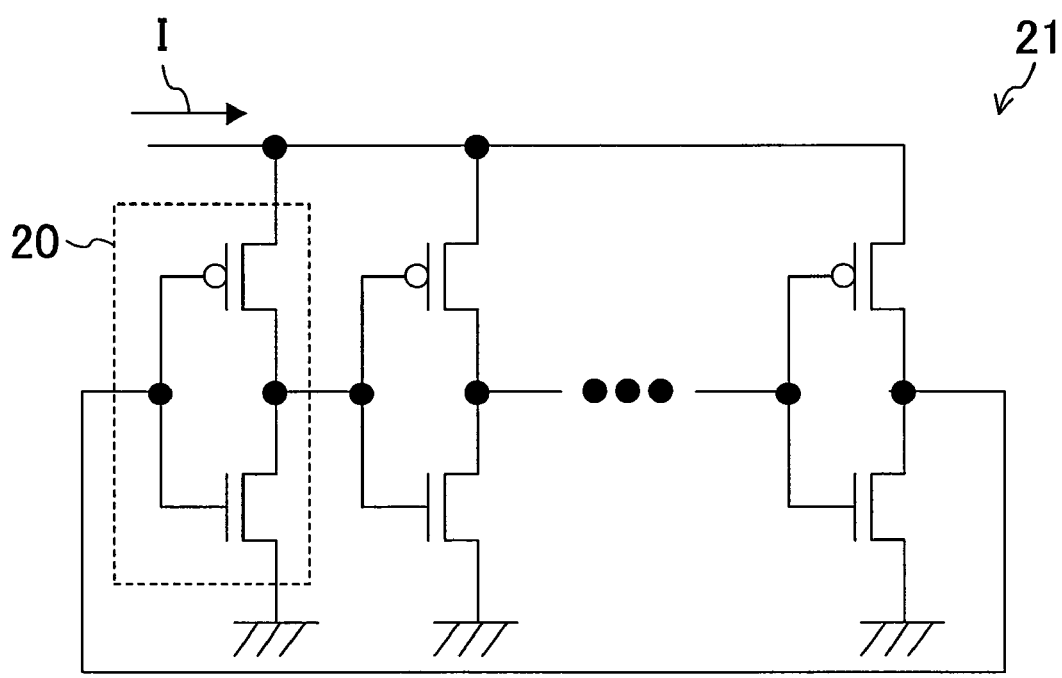
FIG. 9 is a circuit diagram showing a concrete example of the individual ring oscillator in the multi-phase oscillator of FIG. 8.

FIG. 9 shows a concrete example of the individual ring oscillator 21 in the multi-phase oscillator 10 of FIG. 8. The ring oscillator 21 of FIG. 9 is configured by connecting an odd number of inverters 20 in a ring, each of the inverters 20 including a PMOS transistor and an NMOS transistor. Current I is supplied from the voltage-current converter 50 to the source of each PMOS transistor. In this ring oscillator 21, the drivability of each inverter 20 increases as current I becomes larger, and as a result, the multi-phase ring oscillator 10 oscillates at a high frequency.

Figure 10:
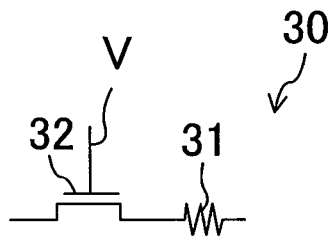
FIG. 10 is a circuit diagram showing a concrete example of a resistance element for phase coupling in the multi-phase oscillator of FIG. 8.

FIG. 10 shows a concrete example of the resistance element 30 for phase coupling in the multi-phase oscillator 10 of FIG. 8. In FIG. 10, a series circuit of a resistor 31 and an NMOS transistor 32 is used as the resistor element 30, and the above-mentioned input voltage V is supplied to the gate of the NMOS transistor 32. In this configuration, the conduction resistance value of the NMOS transistor 32 decreases as input voltage V becomes large, and as a result, the resistance value of the resistance element 30 becomes small. It should be noted that current I from the voltage-current converter 50 may be again converted to a voltage that is proportional to current I before it is supplied to the gate of the NMOS transistor 32.

As described above, in the configuration of FIG. 8, the resistance value of the resistance element 30 for phase coupling becomes small as the oscillation frequency of the multi-phase ring oscillator 10 increases. With higher oscillation frequencies, the transistors used in the ring oscillators 21 have smaller conduction resistance values. Thus, in view of phase output accuracy, the resistance element 30 optimally has a smaller resistance value.

In the example of FIG. 8, the voltage which has a correlation with the oscillation frequency is input voltage V of a voltage-controlled oscillator. Alternatively, a voltage or current having a correlation with the oscillation frequency, which is obtained by frequency to voltage conversion or frequency to current conversion of the oscillation output of the voltage-controlled oscillator, may be used.

Figure 11:
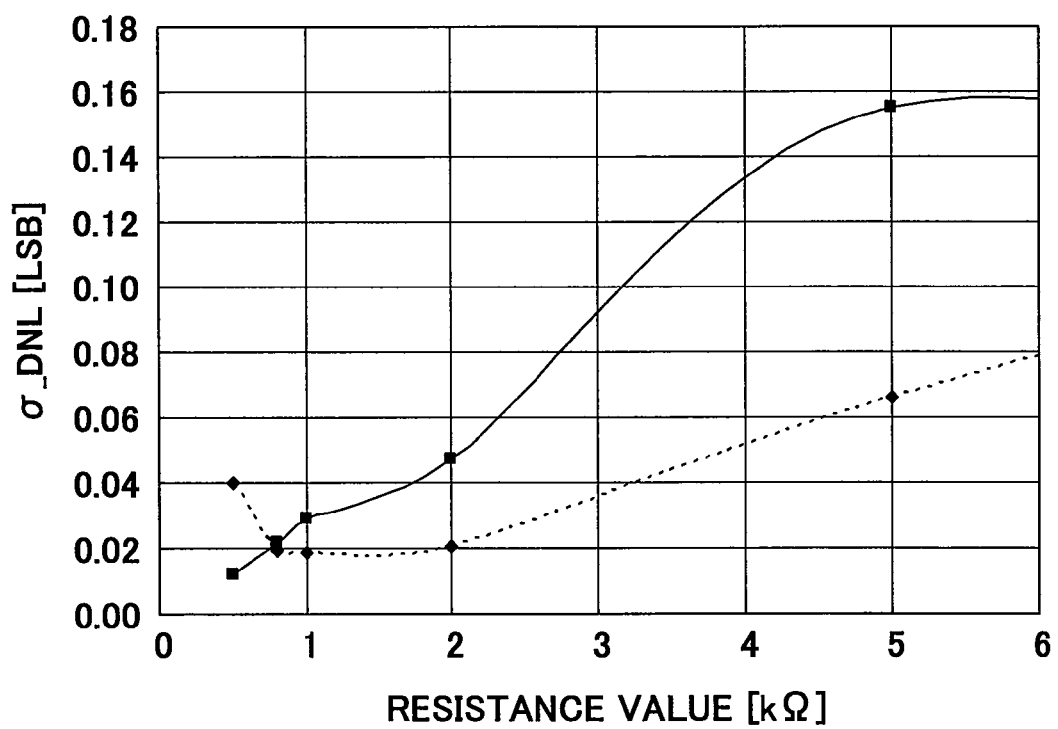
FIG. 11 is a graph showing the relationship between the phase output accuracy and the resistance value of the resistance element for phase coupling in the multi-phase oscillation circuit of FIG. 8.

FIG. 11 is a graph showing the relationship between the phase output accuracy and the resistance value of the resistance element 30 for phase coupling in the multi-phase oscillation circuit of FIG. 8 for different oscillation frequencies. The phase output accuracy has a characteristic that it exhibits a local minimum at a certain resistance value, and accordingly, the local minimum resistance value varies according to the oscillation frequency. It is therefore possible to optimize the phase output accuracy, even if the oscillation frequency varies, by selecting the above local minimum resistance value as the resistance value of the resistance element 30 for phase coupling according to the oscillation frequency.

The multi-phase oscillation circuit of FIG. 8 is preferably applicable to an optical disk recording device, because generation of clocks for write strategies for optical disks requires a multi-phase oscillation circuit capable of achieving high phase output accuracy in both low- and high-speed recordings.

The present invention is also useful for generating timing clocks for various digital controls where a desired phase difference is required with respect to input clocks in a semiconductor circuit.

INDUSTRIAL APPLICABILITY

As explained above, a multi-phase oscillator according to the present invention is useful in a variety of technologies, including generation of multi-phase clock signals.

The invention claimed is:

1. A multi-phase oscillator comprising:
a plurality of ring oscillators each having a plurality of output ports and each formed by connecting an odd number of inverters in a ring; and
a plurality of resistance elements phase-coupling the output ports between the plurality of ring oscillators without inverting phase of outputs of the output ports so that all of the ring oscillators operate at an identical frequency while keeping a desired phase relationship,
wherein one of the plurality of resistance elements is a series circuit of a resistor and a switch.

2. The multi-phase oscillator of claim 1, wherein each of the plurality of resistance elements is a resistor.

3. The multi-phase oscillator of claim 1, wherein each of the plurality of resistance elements is a transistor in a conducting state.

4. A multi-phase oscillator comprising:
a plurality of ring oscillators each having a plurality of output ports and each formed by connecting an odd number of inverters in a ring; and
a plurality of resistance elements phase-coupling the output ports between the plurality of ring oscillators without inverting phase of outputs of the output ports so that all of the ring oscillators operate at an identical frequency while keeping a desired phase relationship,
wherein at least one of the plurality of resistance elements which couples two output ports includes a resistance element and a switch for decoupling the two output ports to initialize a state of the plurality of ring oscillators.

5. The multi-phase oscillator of claim 4, wherein the resistance element and the switch are a series circuit of a resistor and a transistor.

6. A multi-phase oscillator comprising:
a plurality of ring oscillators each having a plurality of output ports and each formed by connecting an odd number of inverters in a ring;
a plurality of resistance elements phase-coupling the output ports between the plurality of ring oscillators without inverting phase of outputs of the output ports so that all of the ring oscillators operate at an identical frequency while keeping a desired phase relationship; and
a circuit for varying a resistance value of the plurality of resistance elements such that the resistance value becomes smaller as an oscillation frequency becomes higher, wherein one of the plurality of resistance elements is a series circuit of a resistor and a switch.

7. The multi-phase oscillator of claim 6, wherein the resistance value of the plurality of resistance elements is selected such that phase linearity of a multi-phase output at the plurality of output ports is optimized.

8. A multi-phase oscillator comprising:
a plurality of ring oscillators each having a plurality of inverters connected in a ring, each of the plurality of inverters has an output port;
a plurality of resistance elements phase-coupling the output ports between the plurality of ring oscillators in a ring without inverting phase of outputs of the output ports,
wherein at least one of plurality of resistance elements includes a resistance element and a switch for decoupling the output ports.

9. The multi-phase oscillator of claim 8, wherein the switch is configured to decouple the output ports to initialize a state of the plurality of ring oscillators.

10. The multi-phase oscillator of claim 8, wherein the switch is on-off controlled by a control signal.

11. The multi-phase oscillator of claim 10, wherein the switch is a transistor of which gate receives the control signal.

12. The multi-phase oscillator of claim 10, wherein:
the switch includes an NMOS transistor and a PMOS transistor connected in parallel, and
a control signal is applied to a gate of NMOS and an inverted control signal which is an inverted signal of the control signal is applies to a gate of PMOS so that the switch is on-off controlled.

13. The multi-phase oscillator of claim 1, wherein:
the plurality of ring oscillators includes the first to the M-th ring oscillators, where M is an integer of two or more,
each of the ring oscillators includes the first to the N-th invertors and the first to the N-th output ports, where N is an odd natural number of 3 or more,
the plurality of resistance elements form the first to the N-th coupling paths,
each of the first to the N-th coupling paths connects the corresponding output ports of the first to the M-th ring oscillators with interposing resistant elements between the output ports, respectively, so that an output signal of the first output port of the first ring oscillator is transferred to the first output ports of the second to M-th ring oscillators via the first coupling path.

14. The multi-phase oscillator of claim 13, wherein each of the first to the N-th coupling paths sequentially connects the corresponding output ports of the first to the M-th ring oscillators.

15. The multi-phase oscillator of claim 13, wherein an output signal of a k-th-output port of the first ring oscillator is transferred to the k-th output ports of the second to M-th ring oscillators via the k-th coupling path, where k=2 to N.

16. The multi-phase oscillator of claim 13, wherein the first output port of the M-th ring oscillator is connected to the third output port of the first ring oscillator.

17. The multi-phase oscillator of claim 4, wherein:
- each of the resistance elements arranged between two adjacent ring oscillators include resistance elements and switches, respectively, and
- a signal line is connected to the switches so that a signal on the signal line turns off the switches at the same time.

18. The multi-phase oscillator of claim 8, wherein:
- each of the resistance elements arranged between two adjacent ring oscillators include resistance elements and switches, respectively, and
- a signal line is connected to the switches so that a signal on the signal line turns off the switches at the same time.

19. The multi-phase oscillator of claim 13, wherein an end of k-th coupling path of the first to the N-th coupling paths is connected to a beginning of (k+2)-th coupling path and an end of the N-th coupling path is connected to a beginning of the second coupling path so that the first to the N-th coupling paths form a loop.

* * * * *